June 10, 1958 J. P. ECKERT, JR 2,838,686

AMPLIFIER FOR PULSE TYPE SIGNALS

Filed July 28, 1955 2 Sheets-Sheet 1

INVENTOR.
JOHN PRESPER ECKERT, JR.
BY
Charles C. English
AGENT

June 10, 1958 J. P. ECKERT, JR 2,838,686

AMPLIFIER FOR PULSE TYPE SIGNALS

Filed July 28, 1955 2 Sheets-Sheet 2

INVENTOR.
JOHN PRESPER ECKERT, JR.
BY
Charles C. English
AGENT

United States Patent Office 2,838,686 Patented June 10, 1958

2,838,686

AMPLIFIER FOR PULSE TYPE SIGNALS

John Presper Eckert, Jr., Philadelphia, Pa., assignor to Sperry Rand Corporation, New York, N. Y., a corporation of Delaware Application July 28, 1955, Serial No. 524,842

17 Claims. (Cl. 307—88)

This invention relates to pulse amplifiers and more particularly to pulse amplifiers using super-regeneration to obtain improved power gain without the usual loss in band pass.

In the prior art, it is well known that a large gain may be obtained by the principles of super-regeneration, but heretofore no circuit has been devised which is suitable for obtaining large amplification by the principles of super-regeneration, when the input is in the form of pulses. One object of the invention is to achieve this result.

Another object of the invention is to provide an amplifier for pulse type signals in which there is a rapid buildup of the output signals.

Still another object of the invention is to provide an amplifier for pulse type signals in which the output signals are terminated at particular periodic intervals, in accordance with the appearance of clock pulses.

It is an additional object of the invention to provide an amplifier for pulse type input signals, in which there is a control over the input so that in response to each input the amplifier builds up to maximum output and remains there until cut off by a clock pulse, at which time whether and when it builds up again depends on whether another input pulse appears.

Other objects of the invention will appear as this description proceeds.

In carrying out the foregoing objects, I provide an amplifier having an output including a feedback path which is fed by the output. This feedback path includes a condenser and resistor in parallel with each other so that upon sudden increase of the output, a large feedback current may flow through the condenser. As the output signal persists, the flow through the condenser tapers off until finally only a small value of current can flow through the feedback path, this being possible by reason of the aforesaid resistor. The feedback current is fed to the input of the amplifier through a buffer and a gate. The buffer also receives the input signals to the amplifying system. The gate is controlled by a clock pulse generator so that the gate is opened periodically.

The foregoing circuit operates as follows. When an input signal appears, it flows through the buffer to the input of said amplifier, causing an increase in output current from the latter. At first, the condenser provides a very low impedance path back to the input of the amplifier, and thus causes a large feedback which greatly increases the output signal. However, as the condenser becomes charged, the current therethrough tapers off and the only feedback current is that flowing through the resistor. This current is just sufficient to hold the amplifier in a state of maximum output or saturation, and therefore the output signal continues. The fact that the condenser is no longer in the circuit and the current is limited by the resistor, means that the feedback path places only a small drain on the output.

At the input of the amplifier there is a buffer with two inputs, one of which is fed by the input to the amplifying system as a whole and the other of which is fed by the feedback path. In addition, there is a gate which may be located either in the feedback path ahead of the buffer, or in the output of the buffer. This gate periodically interrupts the feedback path and thus terminates the output temporarily so that no further output will be available unless there is another signal at the input to the system as a whole. Further details will appear as this description proceeds.

Figure 1:
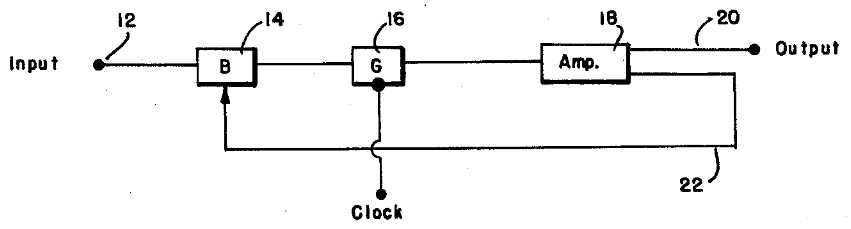
Figure 1 is a block diagram of one form of the invention.

In Figure 1, an input 12 receives the input signals and is regarded as the input to the system as a whole. It is understood that each of the component parts of the system have inputs and outputs, but that input 12 and output 20 may be regarded as the input and the output of the system taken as a whole. Input 12 feeds buffer 14, which has an output connected through gate 16 to amplifier 18. Feedback path 22 feeds buffer 14. Gate 16 is normally conducting, but is opened by clock pulses fed thereto. The circuit operates as follows.

When an input signal is applied at 12, it flows through the buffer 14, and the gate 16, to amplifier 18, and begins to build up the output at 20. However, most of the output is at first fed back via feedback path 22 to the buffer 14 and flows through it and the gate 16 to the amplifier 18, and thus builds up a large output signal. Preferably the feedback path 22 is arranged so that the flow of current therethrough tapers off, thus placing less drain on the output of amplifier 18 and allowing more current to flow to the output 20. Hence, the amplifier 18 builds up to its maximum output where it remains until a clock pulse opens gate 16 and terminates the current flow through amplifier 18. The apparatus is then in a condition to receive another input at 12.

It is clear that the foregoing device is particularly suitable for use in computing and data translating systems where the input signals are likely to occur at predetermined periodic times and where the input signals usually are all of substantially the same magnitude. It is the presence or absence of input signals at 12 (at particular ones of the periodic times) rather than their amplitude, which represents the information which is transmitted through the system. As a result, it is desired that the output at 20 build up to its maximum value in response to each input, and further that the output be accurately terminated at a predetermined time in order to tie-in with the remainder of the system. It is clear that these over-all desired functions are performed by the aforesaid circuit.

Figure 2:
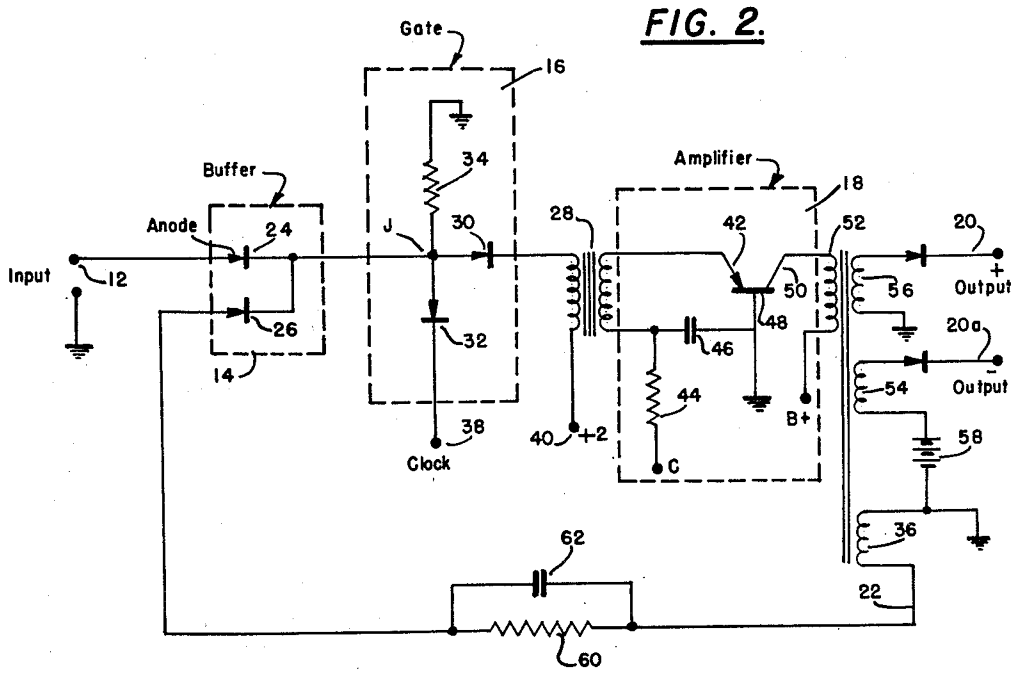
Figure 2 is a schematic diagram of the circuit of Figure 1.
Figure 3:
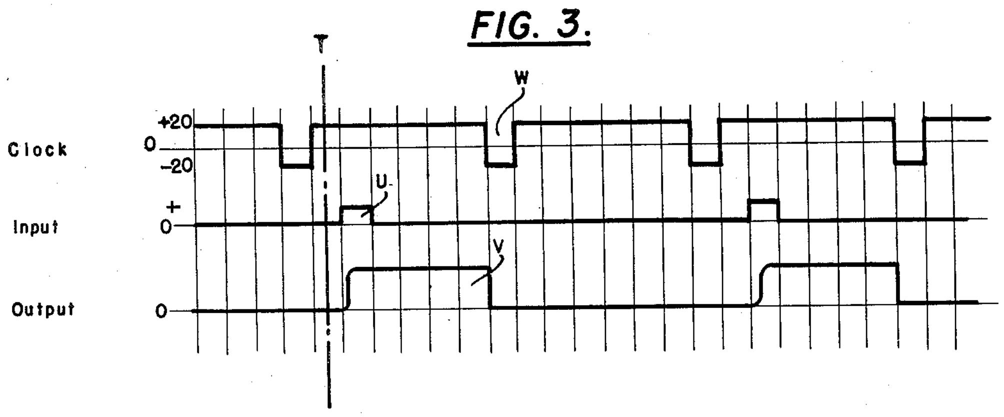
Figure 3 is a timing diagram for the apparatus of Figures 2 and 5.

Figure 2 illustrates the circuit of Figure 1 in greater detail. The input 12 feeds the anode of rectifier 24 of the buffer 14. The feedback path 22 feeds the anode of the rectifier 26 of that buffer and the two cathodes of the buffer are connected together and feed the gate 16. The latter has a resistor 34 connected to ground or to a source of positive potential at its upper end, and is connected at its lower end to the anodes of rectifiers 30 and 32. The cathode of rectifier 32 is normally held by a clock pulse generator 38 at a positive potential, but goes sharply negative at periodic intervals, as shown in Figure 3. The primary of transformer 28 is connected to a source 40 of positive potential which insures that the signal at the input 12 and on the feedback path 22 rises to that potential before any signal energizes the transformer 28. The secondary of the transformer 28 energizes the amplifier 18 which has an output transformer 52 feeding secondary windings 36, 54 and 56. Secondary 56 feeds output 20 with positive-going signals. Secondary 54 feeds a second output 20*a* with negative-going signals. Secondary 36 feeds the feedback path 22. The latter has a condenser 62 shunted across resistor 60.

The amplifier 18 is shown as a transistor amplifier, although any amplifying device can be used. Examples of other amplifiers include vacuum tubes, magnetic amplifiers, etc. In the particular form of amplifier 18 shown, signals from the output winding of transformer 28 are applied to the emitter terminal 42 of transistor 48. A suitable operating bias is provided through limiting resistor 44. By-pass condenser 46 improves the gain for signals in the desired frequency range. The base 48 is grounded to give stable operation. Output signals from the collector 50 pass to the output transformer 52 and into winding 36 of the regeneration loop. Output signals are also induced in windings 54 and 56 which may be connected as shown to give the direct and complementary outputs. A battery 58 can be provided in the complement output circuit to properly reference the negative-going signals from a desired positive potential.

Within the broadest aspects of some of the combinations which I believe to be novel and patentable, the feedback path 22 may return signals from the winding 36 to the buffer 14 without changing such signals. It has been found desirable, however, to provide a frequency selective network in the feedback path. Resistor 60 and by-pass condenser 62 form this network. It should be understood that for fastest operation of the circuit, it is desirable to provide a very large amount of feedback. This will assure that the circuit arrives at the "on" condition with the shortest signal rise time. Once the "on" condition has been established, however, such excessive feedback needlessly uses power which would otherwise be available for the outputs 54 and 56. Accordingly, during the "rise time" period, the condenser 62 passes the signal from winding 36 to the buffer 14 without reducing the magnitude thereof. It will only pass signals, however, having a large derivative. Once the amplifier 18 saturates or limits, the derivative of the signal reduces toward zero and the condenser 62 becomes ineffective as a signal link. The resistor 60, however, continues to pass sufficient regeneration to sustain the saturation condition which then persists until interrupted by the action of the clock on gate 16. Those skilled in the art will recognize that other forms of filter than resistor 60 and condenser 62 can be used. Improved operation can be obtained through the use of many well known, though more complicated and expensive feedback filters.

Referring to Figure 3, it is noted that at time period T, the potential on the clock pulse generator 38 is positive thereby decoupling rectifier 32 and permits junction J to rise to essentially ground potential. Since, however, the potential 40 is greater than that at J, input rectifier 30 remains cut off. Hence, there is no signal at the input of transformer 28. When the next input signal U arrives at input 12, it flows through rectifier 24 and raises the potential at J to a value high enough to energize the primary of transformer 28 and thus produce a signal in the output winding 56 as well as in the feedback winding 36. This latter signal finds a very low impedance path through condenser 62 and is fed through rectifier 26 to the primary of transformer 28. This feedback signal is an amplified form of the original input signal, and therefore has much greater magnitude than the original input signal and consequently causes a regeneration which builds up the output of amplifier 18 quickly to saturation. When saturation is reached, the flow of current through condenser 62 tapers off and, as time continues, the only current in the feedback path is the small current through resistor 60 which is just large enough to hold the amplifier 18 in its saturated condition, assuming that there is no further input signal.

Hence, the output signal shown at V of Figure 3 appears. At time period W, the clock pulse generator 38 goes sharply negative and thus effectively drops point J negative with it, cutting off further flow of signals to the amplifier 18, and hence the output signal V falls sharply to zero. Nothing further can happen until another input signal appears at the input 12. While the clock pulses appear periodically, the input signals are always in the same relative position on the timing diagram with respect to the clock pulses; that is, whenever the input signals occur they always follow the clock pulses by a predetermined space, but the input signals may or may not appear depending on the information being transmitted through the apparatus. This way of signalling is well known to those skilled in the art of computers and data translating systems.

Figure 4:
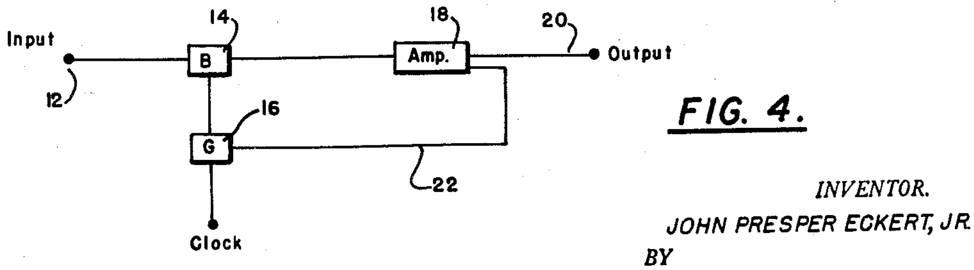
Figure 4 is a block diagram of a modified form of the apparatus.

Figure 4 is a block diagram of a modified form of the invention in which the gate 16 is in the feedback path 22 ahead of the buffer 14. This is distinguished from the circuit of Figure 1 where the gate 16 is in the feedback path 22, but at the output of the buffer instead of the input. The circuit of Figure 5 operates as follows. Here again the circuit consists of an input 12, a buffer 14, a gate 16, an amplifier 18, an output 20 and a feedback path 22. The buffer 14 consists of rectifiers 24 and 26 which are normally non-conducting since their cathodes are connected through the input winding of transformer 28 to a source of positive potential. Signals applied to the anodes of rectifiers 24 and 26 must exceed the value of this bias potential to pass these rectifiers and produce current in the winding of transformer 28. This bias provides a threshold of operation to prevent spurious (noise) signals from undesirably setting the circuit into operation.

The rectifier 24 receives signals from the input terminal 12 while the rectifier 26 receives signals from the gate 16. This gate consists of rectifiers 30 and 32, having their anodes connected together, and to rectifier 26 as well as to the lower end of resistor 34. The upper end of resistor 34 is returned to a source of positive potential which normally renders the rectifier conducting by drawing a small current therethrough and through the feedback path 22. As just described, a feedback path exists from the winding 36 to rectifiers 30 and 26 and thence to the primary winding of transformer 28. Signals exceeding the value of the input bias 40 will pass this circuit to establish the recirculation path through an amplifier 18. Such signals are interrupted by the negative-going clock pulse applied to the terminal 38 which will draw current through the rectifier 32 and resistor 34 to disconnect rectifiers 26 and 30. The resistor 60 and condenser 62 operate in Figure 5 the same as in Figure 2.

Figure 5:
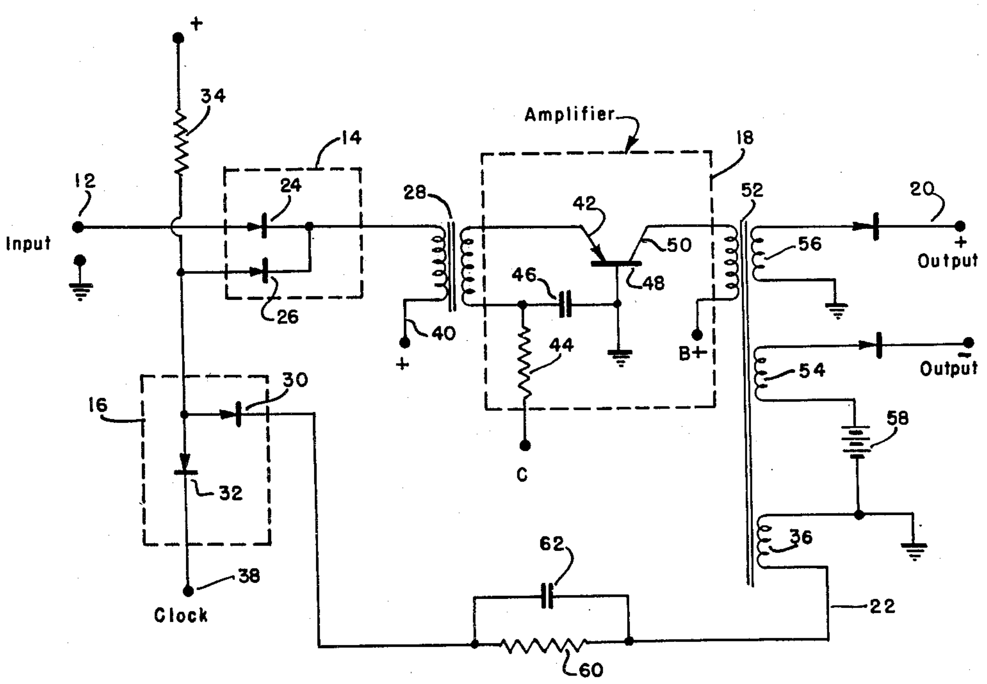
Figure 5 is a schematic diagram of the circuit shown in Figure 4.

It is clear from the foregoing description that the circuit of Figure 5 operates in substantially the same way as that of Figure 2 except as follows. In Figure 2, the gate 16 interrupts both the signals on input 12 and those on the feedback path 22; whereas in Figure 5 the gate 16 interrupts the feedback path alone.

I claim to have invented:

1. In an amplifying system, an input, an amplifier having an output, feedback means fed by said output, said feedback means including means responsive to an increase in signal output of the amplifier for momentarily passing a large percentage of the said signal output and for thereafter passing a smaller percentage of said signal output as a feedback signal, and means fed by said input and by said feedback means for energizing the input of the amplifier, said last-named means including means that periodically interrupts the flow of feedback signals.

2. An amplifying system as defined by claim 1 in which the last-named means interrupts the feedback signals only without interrupting the flow of signals from said input to said amplifier.

3. An amplifying system as defined in claim 1 in which the last-named means interrupts the feedback signals as well as the flow of any signals from said input to said amplifier.

4. In an amplifying system, an input, an amplifier having an output feedback means fed by said output, said feedback means including variable impedance means responsive to an increasing signal output of the amplifier for initially passing a large percentage of said amplifier output, said variable impedance means including means responsive to occurrence of a predetermined signal level at said amplifier output for thereafter passing a smaller percentage of said signal output, and means fed by said input and by said feedback means for energizing the input of the amplifier, said last-named means including a buffer having two inputs respectively fed by the first-named input and by the said feedback means and also including a gate that periodically interrupts the flow of feedback signals to the amplifier.

5. An amplifying system as defined in claim 4 in which the gate is connected between the output of the buffer and the input of the amplifier.

6. An amplifying system as defined in claim 4 in which the gate is connected between the feedback means and that input of the buffer which is fed by the feedback means.

7. In an amplifying system, an input, an amplifier having an output, variable impedance feedback means fed by said output for feeding variable percentages of signals appearing at said output to said input, said feedback means including a resistor one end of which is connected to said output and a condenser shunted across the resistor, and circuit means fed by the other end of said resistor and by said input for energizing the input of said amplifier, and means for periodically preventing the passage of feedback signals via said feedback means.

8. An amplifying system as defined in claim 7 in which said circuit means includes a buffer having two inputs respectively fed by the first-named input and the feedback means and having an output feeding the input of said amplifier.

9. An amplifying system as defined in claim 7 wherein said last-named means includes a gate comprising a portion of said feedback means, and pulse means for periodically opening and closing said gate to control the flow of feedback currents to said amplifier.

10. An amplifying system as defined in claim 9 in which the gate is located between the output of said amplifier and that input of the buffer which is fed by the said feedback means.

11. An amplifying system as defined in claim 7 in which said circuit means includes a buffer having two inputs respectively fed by the first-named input and the feedback means and having an output feeding the input of said amplifier, a gate located between the output of the buffer and the input of the amplifier, and means for opening and closing the gate.

12. In an amplifying system, an input, a saturable amplifier having an output, non-linear feedback means fed by said output, said feedback means including means for passing a lower percentage of amplifier output to said amplifier input when said amplifier output is saturated than when said amplifier output is non-saturated, a buffer having two inputs respectively fed by the first-named input and by the feedback means and having an output feeding the input of the amplifier, a gate comprising a portion of said feedback means for controlling the flow of feedback signals from the output of said amplifier to the input of the amplifier, and means for opening and closing said gate.

13. An amplifying system as defined in claim 12 in which the gate is located between the output of said amplifier and that input of the buffer which is fed by the feedback means.

14. An amplifying system as defined in claim 12 in which the gate is located between the output of the buffer and the input of the amplifying means.

15. In an amplifying system, an amplifier having an input and an output, means for applying an input pulse signal to said amplifier input for causing said amplifier output to rise from a no-signal state toward a predetermined maximum output signal state, feedback means between said output and said input for maintaining said maximum output signal state at said amplifier output subsequence to cessation of said input pulse signal, said feedback means including means responsive to a rising output signal at said amplifier output for initially supplying a relatively large percentage of said output signal to said amplifier input whereby said amplifier rises rapidly to said predetermined maximum output signal state, said feedback means including further means responsive to presence of said maximum output signal state at said amplifier output for supplying a smaller percentage of said output signal to said amplifier input thereby to maintain said predetermined maximum output signal state at said amplifier output, and means for periodically rendering said feedback means inoperative whereby said amplifier returns to its said no-signal state.

16. In combination, a saturable amplifier having an input and an output, means for selectively applying signals to said input for causing the potential at said amplifier output to change from a no-signal state to a saturated output signal state, feedback means between said output and said input, said feedback means including a non-linear network responsive to a changing output signal state for feeding a relatively large percentage of said changing signal to said amplifier input, said non-linear network including means responsive to saturation of said amplifier for feeding a smaller percentage of said saturated amplifier output to said amplifier input, and means for periodically returning said amplifier from its said saturated output signal state to its said no-signal state.

17. In combination, a saturable amplifier having an input and an output and comprising a transistor, means for selectively applying signals to said input for causing the potential at said amplifier output to change from a no-signal state to a saturated output signal state, feedback means between said output and said input, said feedback means including a non-linear network responsive to a changing output signal state for feeding a relatively large percentage of said changing signal to said amplifier input, said non-linear network including means responsive to saturation of said amplifier for feeding a smaller percentage of said saturated amplifier output to said amplifier input, and means for periodically returning said amplifier from its said saturated output signal state to its said no-signal state.

References Cited in the file of this patent

UNITED STATES PATENTS 2,638,811 Williams ---------------- May 19, 1953
2,710,952 Steagall ---------------- June 14, 1955